(12) United States Patent
Nojima et al.

(10) Patent No.: US 7,090,949 B2
(45) Date of Patent: Aug. 15, 2006

(54) METHOD OF MANUFACTURING A PHOTO MASK AND METHOD OF MANUFACTURING A SEMICONDUCTOR DEVICE

(75) Inventors: Shigeki Nojima, Yokohama (JP); Shoji Mimotogi, Yokohama (JP); Satoshi Tanaka, Kawasaki (JP); Toshiya Kotani, Machida (JP); Shigeru Hasebe, Yokohama (JP); Koji Hashimoto, Yokohama (JP); Soichi Inoue, Yokohama (JP); Osamu Ikenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 10/724,738

(22) Filed: Dec. 2, 2003

(65) Prior Publication Data

US 2004/0146788 A1    Jul. 29, 2004

(30) Foreign Application Priority Data

Dec. 2, 2002    (JP)    ............................. 2002-350333

(51) Int. Cl.
*G01F 9/00*    (2006.01)
(52) U.S. Cl. .......................................... 430/5
(58) Field of Classification Search .................... 430/5, 430/394; 716/19, 21
See application file for complete search history.

(56) References Cited

U.S. PATENT DOCUMENTS 6,221,539 B1    4/2001    Kotani et al.
6,567,972 B1*   5/2003    Tanaka et al. ................. 716/21
6,649,310 B1   11/2003    Itoh et al.
6,853,743 B1*   2/2005    Kotani et al. ................ 382/144
2003/0162105 A1*  8/2003    Nojima et al. ................. 430/5

FOREIGN PATENT DOCUMENTS

| JP | 2000-81697 A | 3/2000 |
| JP | 2001-188336 | 7/2001 |
| JP | 2002-072440 | 3/2002 |
| JP | 2002-148779 | 5/2002 |
| JP | 2002-351048 | 12/2002 |

OTHER PUBLICATIONS

Notification of Reasons for Rejection mailed Jul. 5, 2005, in Japanese Patent App. No. 2002-350333, and English language translation thereof.

* cited by examiner

*Primary Examiner*—S. Rosasco
(74) *Attorney, Agent, or Firm*—Finnegan, Henderson, Farabow, Garrett & Dunner, L.L.P.

(57) ABSTRACT

Disclosed is a method of manufacturing a photo mask comprising preparing mask data for a mask pattern to be formed on a mask substrate, calculating edge moving sensitivity with respect to each of patterns included in the mask pattern using the mask data, the edge moving sensitivity corresponding to a difference between a proper exposure dose and an exposure dose to be set when a pattern edge varies, determining a monitor portion of the mask pattern, based on the calculated edge moving sensitivity, actually forming the mask pattern on the mask substrate, acquiring a dimension of a pattern included in that portion of the mask pattern formed on the mask substrate which corresponds to the monitor portion, determining evaluation value for the mask pattern formed on the mask substrate, based on the acquired dimension, and determining whether the evaluation value satisfies predetermined conditions.

16 Claims, 8 Drawing Sheets

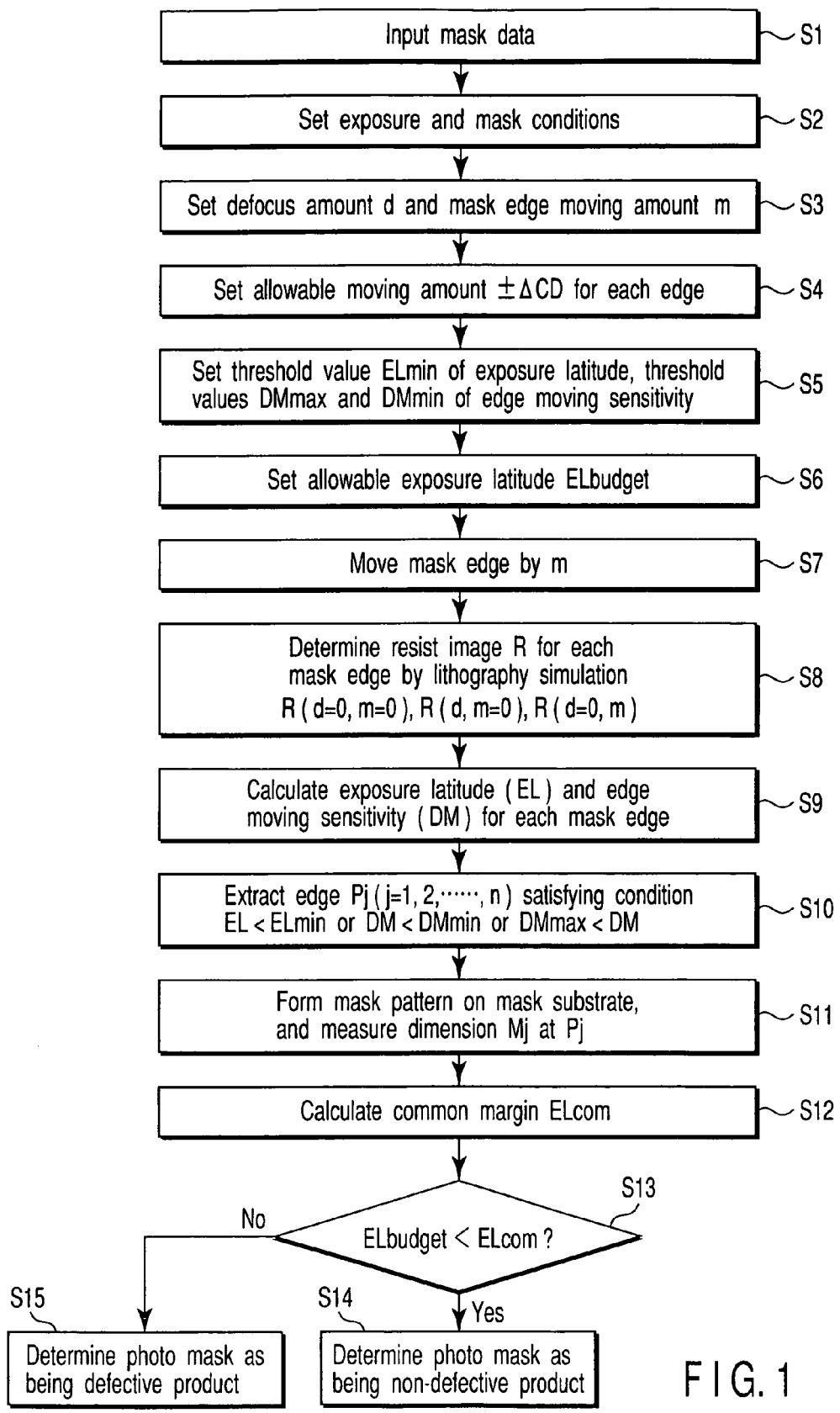
F I G. 1

METHOD OF MANUFACTURING A PHOTO MASK AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2002-350333, filed Dec. 2, 2002, the entire contents of which are incorporated herein by reference.

BACKGROUND OF THE INVENTION

1. Field of the Invention

The present invention relates to a method of manufacturing a photo mask, and a method of manufacturing a semiconductor device using the manufactured photo mask.

2. Description of the Related Art

Recently, strict dimension accuracy has rapidly become required in photo masks; for example, the allowable range of dimension uniformity within the mask is less than 10 nm. In the photo mask manufacture, many items are given to determine whether the photo mask is a non-defective or defective product. In these items, if there exists even one item, which does not satisfy the specification, the photo mask has been conventionally determined as being a defective product. Therefore, the photo mask yield inevitably worsens under the present circumstances that the photo mask requires strict dimension accuracy.

Conventionally, the photo mask specification has been determined so that desired exposure latitude is obtained even if all of items are the lowest limit value satisfying the specification. However, in actually manufactured photo masks, it is extremely rare that all items have the lowest limit value satisfying the specification. In many cases, a certain item exceeds the specification value while other items are within an allowable range of the specification value with margins. For this reason, there exists photo masks satisfying the desired exposure latitude in photo masks disposed as defective product.

In order to solve the foregoing problem, JPN. PAT. APPLN. KOKAI Publication No. 2002-72440 discloses the following method. According to the method, exposure latitude is calculated based on the pattern dimension average value of the photo mask and the uniformity within the mask. From the calculation result, it is determined whether the photo mask is a non-defective or defective product. However, according to the method, it is possible to extract patterns having low exposure latitude, but it is difficult to extract portions potentially degrading the exposure latitude. Therefore, the method is not suitable for securely extracting a monitor portion used to determine whether the photo mask is non-defective or defective.

Conventionally, it is difficult to properly extract the monitor portion (dangerous portion) used to determine whether the photo mask is non-defective or defective. Therefore, it is desired to provide a method of manufacturing a photo mask, which can properly and readily determine whether the photo mask is non-defective or defective.

BRIEF SUMMARY OF THE INVENTION

According to a first aspect of the present invention, there is provided a method of manufacturing a photo mask comprising: preparing mask data for a mask pattern to be formed on a mask substrate; calculating edge moving sensitivity with respect to each of patterns included in the mask pattern using the mask data, the edge moving sensitivity corresponding to a difference between a proper exposure dose and an exposure dose to be set when a pattern edge varies; determining a monitor portion of the mask pattern, based on the calculated edge moving sensitivity; actually forming the mask pattern on the mask substrate; acquiring a dimension of a pattern included in that portion of the mask pattern formed on the mask substrate which corresponds to the monitor portion; determining evaluation value for the mask pattern formed on the mask substrate, based on the acquired dimension; and determining whether the evaluation value satisfies predetermined conditions.

According to a second aspect of the present invention, there is provided a method of manufacturing a photo mask comprising: preparing mask data for a mask pattern to be formed on a mask substrate; calculating a distance from an adjacent pattern with respect to each of patterns included in the mask pattern using the mask data; determining a monitor portion of the mask pattern, based on the calculated distance; actually forming the mask pattern on the mask substrate; acquiring a dimension of a pattern included in that portion of the mask pattern formed on the mask substrate which corresponds to the monitor portion; determining evaluation value for the mask pattern formed on the mask substrate, based on the acquired dimension; and determining whether the evaluation value satisfies predetermined conditions.

BRIEF DESCRIPTION OF THE SEVERAL VIEWS OF THE DRAWING

FIG. 1 is a flowchart to explain a method of manufacturing a photo mask according to a first embodiment of the present invention;

DETAILED DESCRIPTION OF THE INVENTION

Figure 2:
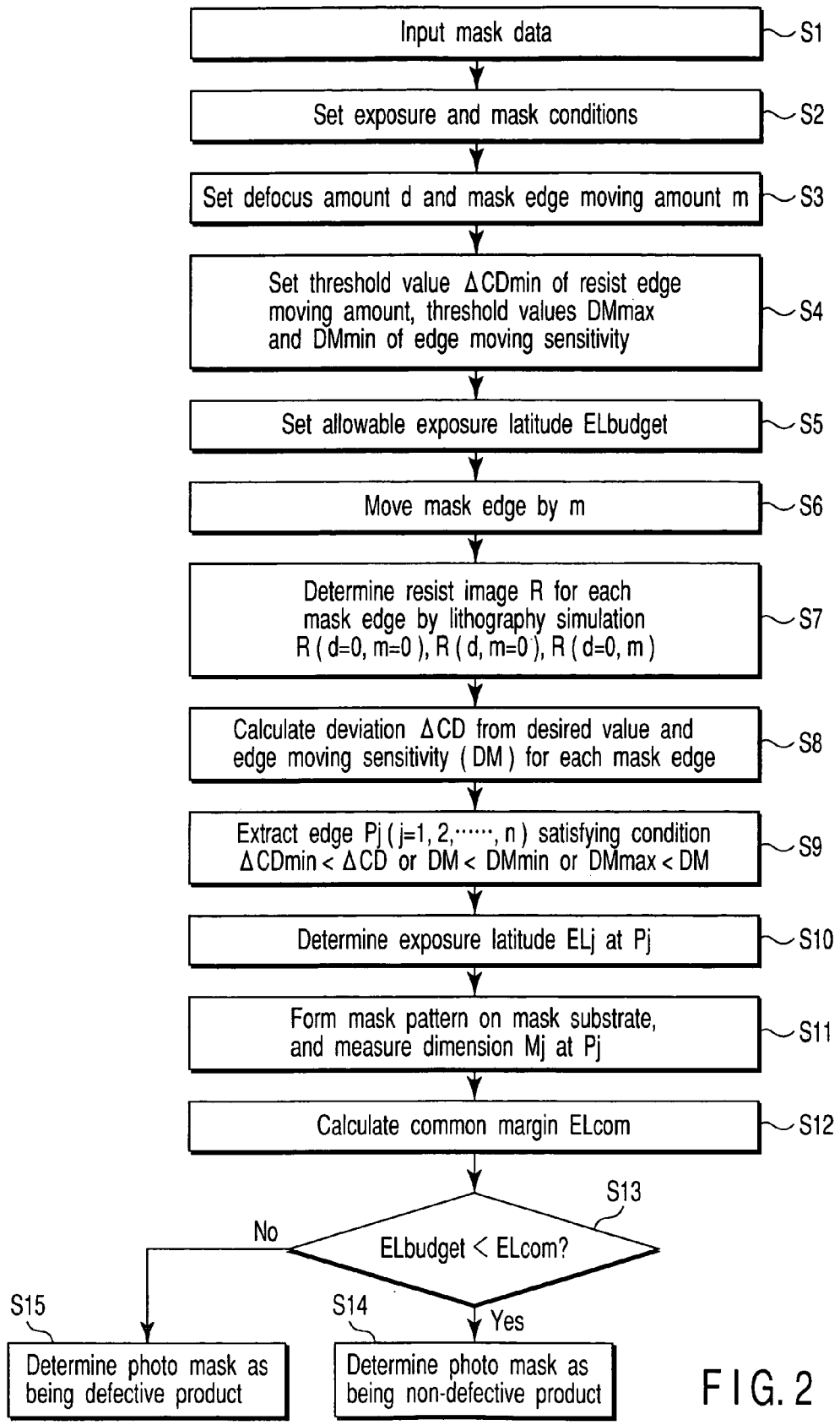
FIG. 2 is a flowchart to explain a method of manufacturing a photo mask according to a second embodiment of the present invention.

Embodiments of the present invention will be described below with reference to the accompanying drawings.

FIRST EMBODIMENT

FIG. 1 is a flowchart to explain a method of manufacturing a photo mask according to a first embodiment of the present invention.

First, mask data (design data) that has undergone data processing such as proximity correction is inputted to a computer (step S1). Further, exposure and mask conditions are set (step S2). More specifically, wavelength, numerical aperture and illumination shape are given as the exposure conditions. On the other hand, the kind of mask and its transmittance are given as the mask conditions. The kind of mask includes a half tone type phase shift mask and an alternative type phase shift mask.

In order to determine lithography margin, a defocus value d and a mask edge moving amount (edge moving amount of pattern to be formed on photo mask) m are set (step S3). In order to calculate the lithography margin, resist edge allowable moving amount ±ΔCD (Critical Dimension: processing dimension of photo resist pattern corresponding to mask pattern) is set for each mask edge (step S4). In order to extract dangerous pattern, the threshold value ELmin of exposure latitude, the upper limit value DMmax of edge moving sensitivity DM and the lower limit value DMmin thereof are set (step S5). Further, allowable exposure latitude ELbudget is set in order to determine whether the photo mask is a non-defective or defective product (step S6).

The edge moving sensitivity DM will be explained below. Exposure dose for forming a photo resist pattern having a desired proper dimension (target dimension), when a mask pattern having a desired proper dimension (target dimension) is transferred (projected) to the photo resist, is determined as a proper (appropriate) exposure dose. In other words, exposure is carried out with proper exposure dose using the mask pattern having the proper dimension, and thereby, photo resist pattern having proper dimension is obtained. However, mask pattern having a dimension deviating from the proper dimension may be manufactured. In such a case, exposure is carried out with exposure dose deviating from the proper exposure dose, and thereby, resist pattern having a proper dimension can be formed. The relationship between Δm (corresponding to mask edge moving amount m) and ΔE changes in accordance with pattern. The Δm represents a deviation from the proper dimension of the mask pattern, and the ΔE represents a deviation from the proper exposure dose to be set in accordance with the shift Δm. Therefore, the relationship between the deviations ΔE and Δm is a significant factor to extract dangerous pattern. Thus, the edge moving sensitivity DM corresponding to ΔE/Δm is used as the index, and the upper limit value DMmax of the edge moving sensitivity DM and the lower limit value DMmin thereof are set in step S5. Incidentally, the edge moving sensitivity DM may be called Dose MEF (mask error enhancement factor).

After step S6, mask edge (mask pattern edge) is moved by the moving amount m (corresponding to Δm) set in step S3 (step S7). Photo resist pattern shape (resist image R) is calculated by lithography simulation. More specifically, the following resist images R are determined from the calculation with respect to each pattern edge (step S8). One is a resist image R (d=0, m=0) having best focus and no mask edge moving. Another is a resist image R (d, m=0) having defocus d and no mask edge moving. Further, another is a resist image R (d=0, m) having best focus and mask edge moving amount m.

The exposure latitude EL and the edge moving sensitivity DM are calculated for every mask edge (step S9). In addition, it is determined whether or not exposure latitude EL and edge moving sensitivity DM for each mask edge satisfy predetermined conditions. More specifically, it is determined whether or not the exposure latitude EL is lower than the threshold value ELmin (EL<ELmin). In addition, it is determined whether or not the edge moving sensitivity DM is lower than DMmin (DM<DMmin) or higher than DMmax (DM>DMmax). An edge Pj satisfying the conditions "EL<ELmin", "DM<DMmin" or "DM>DMmax" is extracted as dangerous portion (monitor portion) (step S10). In this case, Pj (j=1, 2, ... n) represents edge portion.

A photo mask is actually formed on a mask substrate. Each pattern dimension on the photo mask is measured using the dangerous portion extracted in the foregoing manner as a measuring point. A dimension at each measuring point is set as Mj (step S11).

Common margin ELcom is determined from measured pattern dimension Mj, exposure latitude (ELj) and edge moving sensitivity (DMj) calculated for every mask edge in step S9 (step S12).

The above-mentioned common margin ELcom will be described below. The exposure latitude ELj and edge moving sensitivity DMj are variable in accordance with pattern size Mj. Therefore, process window on ED tree changes in accordance with Mj, ELj and MDj. In this case, the ED tree means the coordinate plane having exposure dose as the horizontal axis (abscissa) and taking defocus position as the vertical axis (ordinate). The common portion of the process window of each pattern (edge) is used as common margin ELcom, and thus, in step S12, the common margin ELcom is calculated.

Comparison is made between the allowable exposure latitude ELbudget set in step S6 and the common margin ELcom calculated in step S12 (step S13). If the condition of ELbudget<ELcom is satisfied, it is determined that the photo mask is a non-defective product (step S14). On the other hand, if the condition is not satisfied, it is determined that the photo mask is a defective product (step S15).

A certain mask is evaluated using a technique of the present embodiment. As a result, a hole pattern having high exposure latitude EL and edge moving sensitivity DM is extracted as a dangerous pattern, and thus, accurate judgment can be made. In addition, isolated line pattern having slightly high exposure latitude EL and low edge moving sensitivity DM is extracted as dangerous pattern, and thus, accurate judgment can be made.

According to the present embodiment, the edge moving sensitivity DM is calculated with respect to each edge in addition to the exposure latitude EL. Based on the calculation result, the dangerous portion (monitor portion) is extracted. Thereafter, it is determined whether or not the exposure latitude for the extracted dangerous portion satisfies predetermined conditions. The dangerous portion is specified taking the edge moving sensitivity DM into consideration, and thereby, it is possible to securely extract portions potentially degrading the exposure latitude. Consequently, it is securely and readily determined whether the photo mask is non-defective or defective.

The method of calculating the common margin in the embodiment will be described below in detail.

The following exposure dose is determined with respect to best focus (d=0) and defocus d. In this case, according to the exposure dose, resist edge deviates from proper resist edge by ±ΔCD. Each exposure dose is expressed as follows.

$$E(d=0, +\Delta CD)$$

$$E(d=0, -\Delta CD)$$

$$E(d, +\Delta CD)$$

$$E(d, -\Delta CD)$$

The exposure dose E with respect to −d defocus is equal to the exposure dose E with respect to +d defocus. Therefore, process window can be determined using these four exposure doses E.

Figure 3:
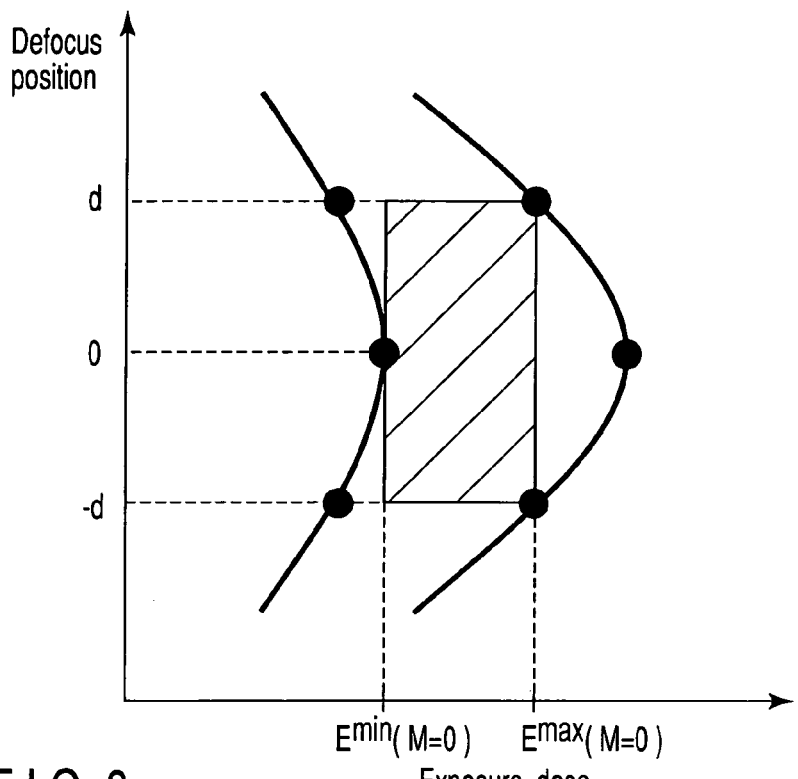
FIG. 3 is a graph showing one example of process window.

FIG. 3 shows process window (slant line portions) determined in the manner described above, which is a process window with respect to line pattern. $E^{max}$ and $E^{min}$ defining the window with respect to line pattern are determined from four exposure doses. Thus, $E^{max}$ and $E^{min}$ are expressed as follows.

$$E^{max}(M=0)=\min [E(d=0, -\Delta CD), E(d, -\Delta CD)]$$

$$E^{min}(M=0)=\max [E(d=0, +\Delta CD), E(d, +\Delta CD)]$$

$E^{max}$ and $E^{min}$ defining the window with respect to space pattern are expressed as follows.

$$E^{max}(M=0)=\min [E(d=0, +\Delta CD), E(d, +\Delta CD)]$$

$$E^{min}(M=0)=\max [E(d=0, -\Delta CD), E(d, -\Delta CD)]$$

In the manner described above, $E^{max}$ and $E^{min}$ are determined with respect to each dangerous portion. Further, window position when mask edge deviates by M is determined from edge moving sensitivity DM at proper exposure dose and deviation M at measured each mask edge. The window position is expressed as follows.

$$E^{max}(M)=E^{max}(M=0)+DM \times M$$

$$E^{min}(M)=E^{min}(M=0)+DM \times M$$

The common window position is expressed as follows.

$$E^{max}=\min[E^{max}(M)]$$

$$E^{min}=\max[E^{min}(M)]$$

In this case, if the number of dangerous pattern is set as n, min [$E^{max}$(M)] and max [$E^{min}$(M)] represent the n minimum value and the n maximum value, respectively. Common margin is determined from $E^{max}$ and $E^{min}$.

In the embodiment, calculation is made with respect to each mask edge (pattern edge); in this case, calculation may be made with respect to each pattern. In addition, the lower limit value DMmin is set; in this case, DMmin need not be set. In the embodiment, only a dimension is given as the subject in question. In this case, phase difference, transmittance and mask writing misalignment may be taken into consideration together with dimension.

Figure 4:
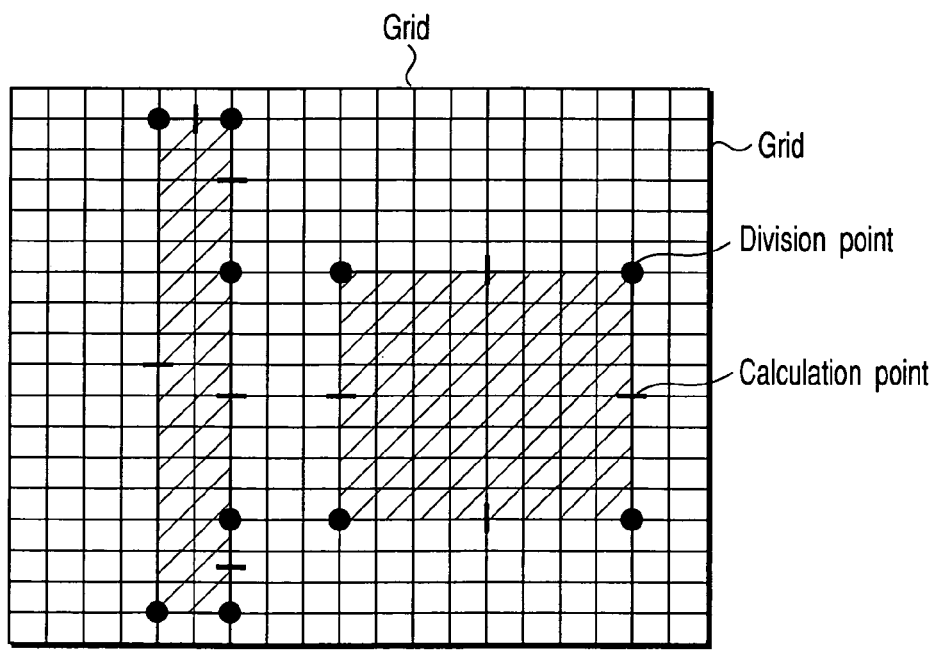
FIG. 4 is a view showing design data grids.

In the embodiment, it is preferable that the calculation position when calculating the edge moving sensitivity corresponds to grid position used when making design data (see FIG. 4). Preferably, the mask edge moving amount m is set using grid as a unit. In addition, the calculation position when calculating the edge moving sensitivity may be made to correspond to division point or calculation point used in proximity correction, such as optical proximity correction. In this case, it is possible to intactly use the moving sensitivity of proper exposure dose used when making proximity correction. By doing so, calculation cost for extracting dangerous pattern can be reduced.

If many dangerous portions are extracted, measurement cost and time increase to measure dimension with respect to all of these portions. In such a case, if the dangerous portions are included in a repeated pattern such as memory cell, a certain pattern is selected from many repeated patterns as a typical pattern (standard pattern), and thereafter, the dimension is measured. The dimension for other patterns may be estimated based on the standard pattern. For example, the standard pattern is measured at several points within mask, and deviations and variations from a desired value are measured with respect to the standard pattern. In other patterns, deviation from the desired value may be estimated using the measurement result relevant to the standard pattern. Estimated deviation is set to a range from one to two times as much as the deviation in the standard pattern, and thereby, the deviation can be high precisely set.

The exposure latitude changes in accordance with the easiness of device forming and resist characteristics. For example, when estimating the exposure latitude, the exposure latitude may be simply determined from optical image. In this case, the exposure latitude may be determined based on calculation result considering photo resist characteristic or etching characteristic. In addition, cell pattern may be used as the pattern for determining the exposure latitude, or core circuit, that is, a pattern having the lowest exposure latitude may be used. According to simulation, the pattern shape may be directly captured. In phase shift mask, it is difficult to measure phase and transmittance. In this case, the exposure latitude may be calculated using predetermined specification values for phase and transmittance and using measured values of the actual mask for pattern dimension. The method of the present embodiment is applicable to logic devices having no or few repeated patterns, in addition to memory devices. More specifically, patterns for obtaining average dimension value and for obtaining dimension variations are set separately.

SECOND EMBODIMENT

FIG. 2 is a flowchart to explain a method of manufacturing a photo mask according to a second embodiment of the present invention.

First, mask data (design data) is inputted (step S1), exposure and mask conditions are set (step S2), and defocus value d and mask edge moving amount m are set (step S3), like the first embodiment.

The following parameters are set in order to extract dangerous pattern (step S4). One of the parameters is a threshold value ΔCDmin of a resist edge moving amount, and another is a threshold value ELmin of exposure latitude. A further one is the upper and lower limit values DMmax and DMmin of edge moving sensitivity DM. The allowable exposure latitude ELbudget is set in order to determine whether a photo mask is non-defective or defective product (step S5).

The mask edge is moved by the moving amount m set in step S3 (step S6). Resist pattern shape (resist image R) is calculated by lithography simulation. More specifically, the following resist images R are determined from the calculation (step S7). One of the resist images R is a resist image R (d=0, m=0) having best focus and no mask edge moving. Another is a resist image R (d, m=0) having defocus d and no mask edge moving. Further, another is a resist image R (d=0, m) having best focus and mask edge moving amount m.

Resist edge moving amount (i.e., deviation from proper edge position) $\Delta CD$ and edge moving sensitivity DM are calculated for every mask edge (step S8). In addition, it is determined whether or not $\Delta CD$ and DM for each mask edge satisfy predetermined conditions. More specifically, it is determined whether or not the $\Delta CD$ is higher than the threshold value $\Delta CDmin$ ($\Delta CD>\Delta CDmin$). In addition, it is determined whether or not the DM is smaller than DMmin (DM<DMmin) or larger than DMmax (DM>DMmax). An edge Pj satisfying the conditions "$\Delta CD>\Delta CDmin$", "DM<DMmin" or "DM>DMmax" is extracted as dangerous portion (monitor portion) (step S9).

An exposure latitude ELj is calculated with respect to the extracted dangerous portion (step S10). A photo mask is actually formed on a mask substrate. Each pattern dimension Mj on the photo mask is measured using the extracted dangerous portion as a measuring point (step S11).

Common margin ELcom is determined from measured each pattern dimension Mj, $\Delta CDj$, DMj and ELj calculated for each mask edge in steps S9 and S10 (step S12).

Comparison is made between the allowable exposure latitude ELbudget set in step S5 and the common margin ELcom calculated in step S12 (step S13). If the condition of ELbudget<ELcom is satisfied, it is determined that the photo mask is a non-defective product (step S14). On the other hand, if the condition is not satisfied, it is determined that the photo mask is a defective product (step S15).

A certain mask is evaluated using a technique of the present embodiment. As a result, hole pattern having high exposure latitude EL and edge moving sensitivity DM is extracted as dangerous pattern, and thus, accurate judgment can be made. In addition, isolated line pattern having slightly high exposure latitude EL and low edge moving sensitivity DM is extracted as dangerous pattern, and thus, accurate judgment can be made.

According to the present embodiment, the resist edge moving amount $\Delta CD$ and the edge moving sensitivity DM are calculated with respect to each edge. Based on the calculation result, the dangerous portion (monitor portion) is specified. Thereafter, it is determined whether or not the exposure latitude for the extracted dangerous portion satisfies predetermined conditions. The dangerous portion is specified taking the edge moving sensitivity DM into consideration. By doing so, it is possible to securely extract portions potentially degrading the exposure latitude, like the first embodiment. Consequently, it is securely and readily determined whether the photo mask is non-defective or defective.

In the second embodiment, it is possible to properly carry out the method of calculating the common margin and various modifications described in the first embodiment.

THIRD EMBODIMENT

Figure 5:
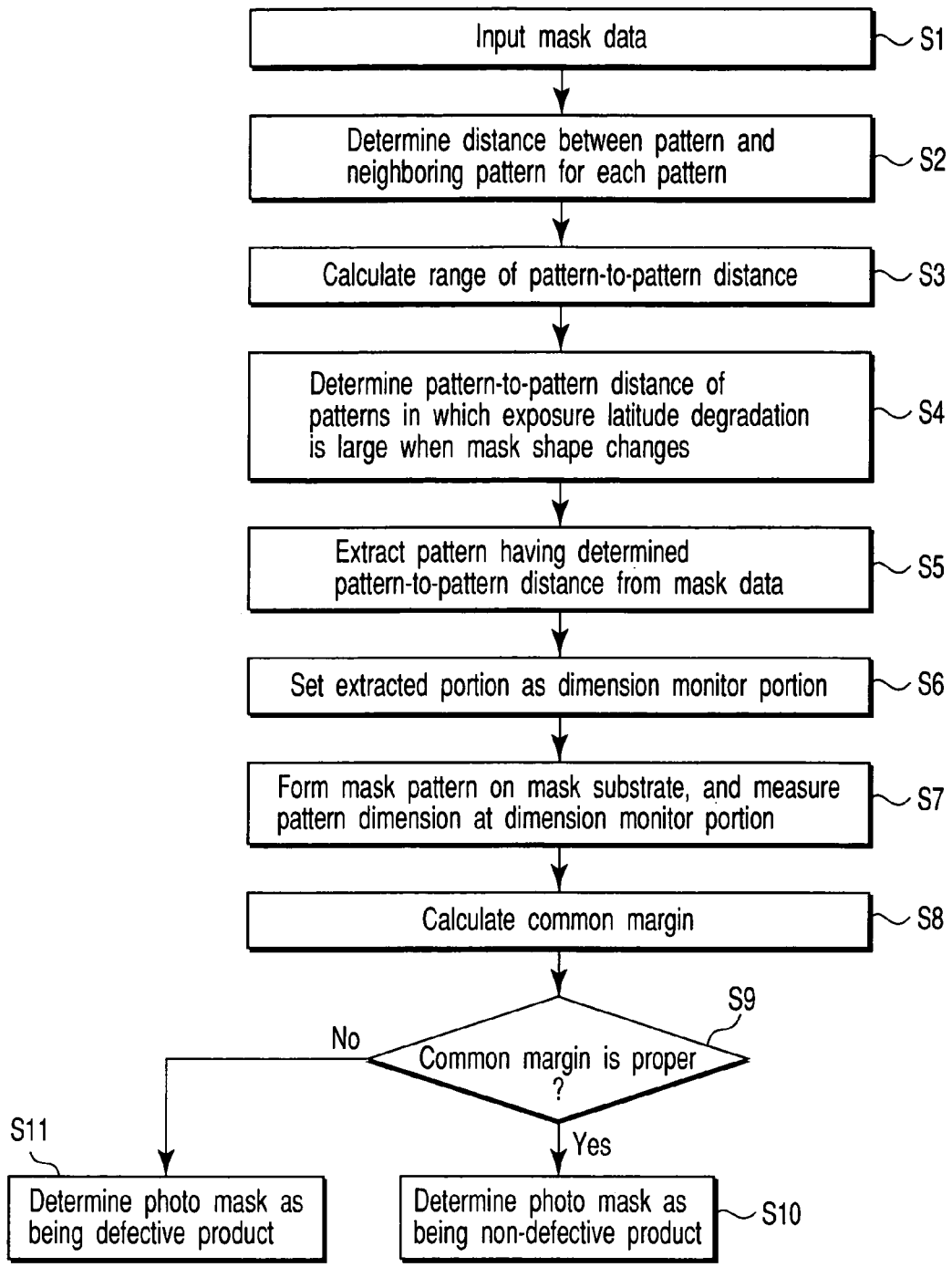
FIG. 5 is a flowchart to explain a method of manufacturing a photo mask according to a third embodiment of the present invention.

FIG. 5 is a flowchart to explain a method of manufacturing a photo mask according to a third embodiment of the present invention.

First, mask data (design data) that has undergone data processing such as proximity correction is inputted to a computer (step S1). Based on the mask data, data processing for determining the distance between neighboring patterns is carried out with respect to each pattern included in all or part of regions (step S2).

A range of the distance between neighboring patterns (pattern-to-pattern distance) is calculated from maximum and minimum values of the pattern-to-pattern distance obtained by data processing (step S3). In this case, the minimum pattern-to-pattern distance is set to 0.38 μm; on the other hand, the maximum pattern-to-pattern distance is set to 150 μm. However, the maximum pattern-to-pattern distance is not necessarily determined, because, there is no influence given to transfer pattern so long as the pattern-to-pattern distance is set to a range receiving no influence by the following proximity effects. One is the optical proximity effect in the mask pattern transfer (projection) process, another is process proximity effect in the wafer process, and a further is process proximity effect in the photo mask manufacturing process. In addition, process time greatly increases to determine the maximum pattern-to-pattern distance on data. Therefore, the maximum pattern-to-pattern distance is not necessarily determined. In the third embodiment, it is recognized that there exists the pattern-to-pattern distance (e.g., 4 μm or more) receiving no influence by the foregoing proximity effects, and thereby, data processing is completed.

Data processing is already carried out with respect to dangerous pattern having low exposure latitude included in mask data, independently from the foregoing series of data processing. Thus, the extraction of the dangerous pattern (dangerous portion) is completed. Therefore, the dangerous portion is already set as dimension monitor portion. However, there is a possibility of missing a potentially dangerous pattern if the data processing described above is merely carried out. The potentially dangerous pattern is a pattern such that the exposure latitude is not so low, but exposure latitude degradation is large when the mask shape changes. In other words, the potentially dangerous pattern is a pattern in which the edge moving sensitivity does not satisfy predetermined conditions described in the first embodiment (i.e., pattern having condition DM<DMmin or DM>DMmax). If the mask shape largely changes, there is a possibility that desired exposure latitude is not maintained.

Figure 9:
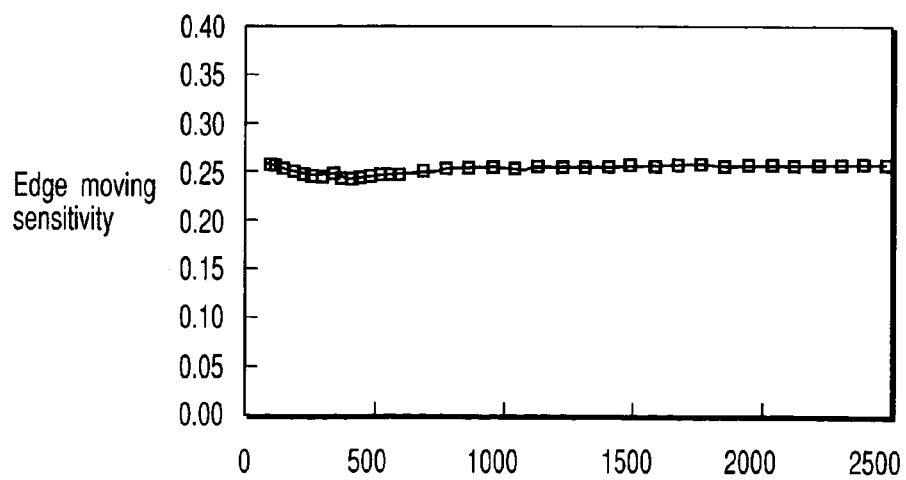
FIG. 9 is a graph to explain a relationship between neighboring pattern dimension and edge moving sensitivity.
Figure 10:
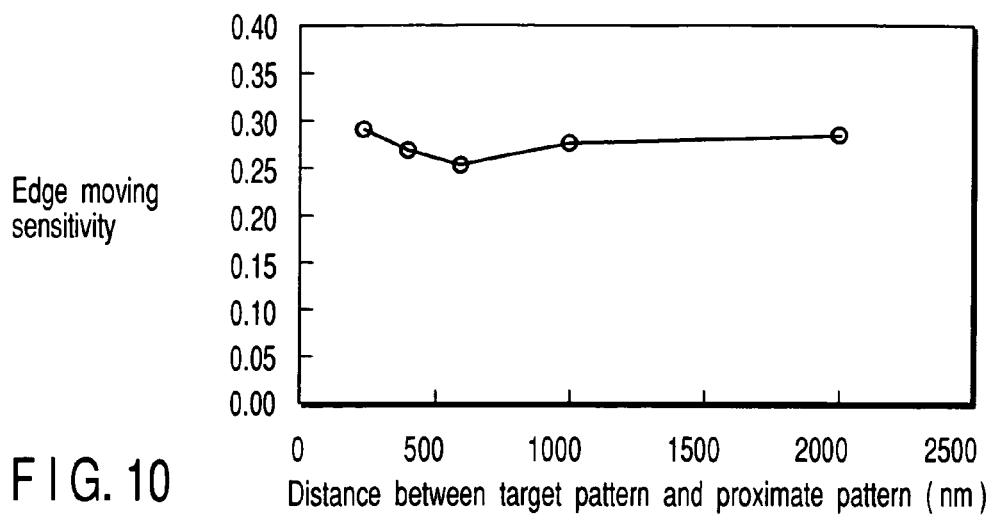
FIG. 10 is a graph to explain a relationship between a distance between neighboring patterns and edge moving sensitivity.

The foregoing pattern-to-pattern distance is given as one of factors used to extract pattern in which exposure latitude degradation is large, that is, edge moving sensitivity does not satisfy predetermined conditions. FIG. 9 shows a lithography simulation result when neighboring pattern dimension is changed in a state of fixing a target pattern dimension and a distance between the target pattern and the neighboring pattern (proximate pattern). From the result, the edge moving sensitivity has almost no change even if the neighboring pattern dimension varies. FIG. 10 shows a lithography simulation result when the distance between the target pattern and the neighboring pattern is changed in a state of fixing target pattern and neighboring pattern (proximate pattern) dimensions. From the result, it can be seen that the difference occurs in the edge moving sensitivity in accordance with the pattern-to-pattern distance even if pattern dimension is unchanged.

After step S3, the pattern-to-pattern distance of the pattern in which the edge moving sensitivity does not satisfy predetermined conditions is determined within the range set in step S3 (step S4). For example, the pattern-to-pattern distance in which the edge moving sensitivity becomes high is determined. In the embodiment, the edge moving sensitivity becomes high when the pattern-to-pattern distance is 0.38 μm and 2.0 μm. A pattern having the above-mentioned pattern-to-pattern distance (0.38 μm and 2.0 μm in the embodiment) is extracted from mask data (step S5). A portion corresponding to the extracted pattern is set as a dimension monitor portion (dangerous portion) (step S6).

The basic operation of steps S7 to S11 following the above is substantially the same as the first embodiment. More specifically, each pattern dimension on the actually manufactured photo mask is determined using the extracted dimension monitor portion as a measuring point (step S7). Common margin is determined based on the determined pattern dimension and exposure latitude determined every mask edge (step S8). Comparison is made between preset allowable exposure latitude and the common margin calculated in step S8 (step S9). If the common margin satisfies predetermined conditions, it is determined that the photo mask is a non-defective product (step S10). On the other hand, if the common margin does not satisfy predetermined conditions, it is determined that the photo mask is a defective product (step S11).

In the third embodiment, the pattern-to-pattern distance giving large influence to the edge moving sensitivity is extracted as monitor portion (dangerous portion). It is determined whether photo mask is non-defective or defective using the measured result at the extracted monitor portion. The monitor portion is specified taking the pattern-to-pattern distance into consideration, and thereby, a portion potentially degrading the exposure latitude is securely extracted. Consequently, it is possible to securely and readily determine whether the photo mask is non-defective or defective.

FOURTH EMBODIMENT

Figure 6:
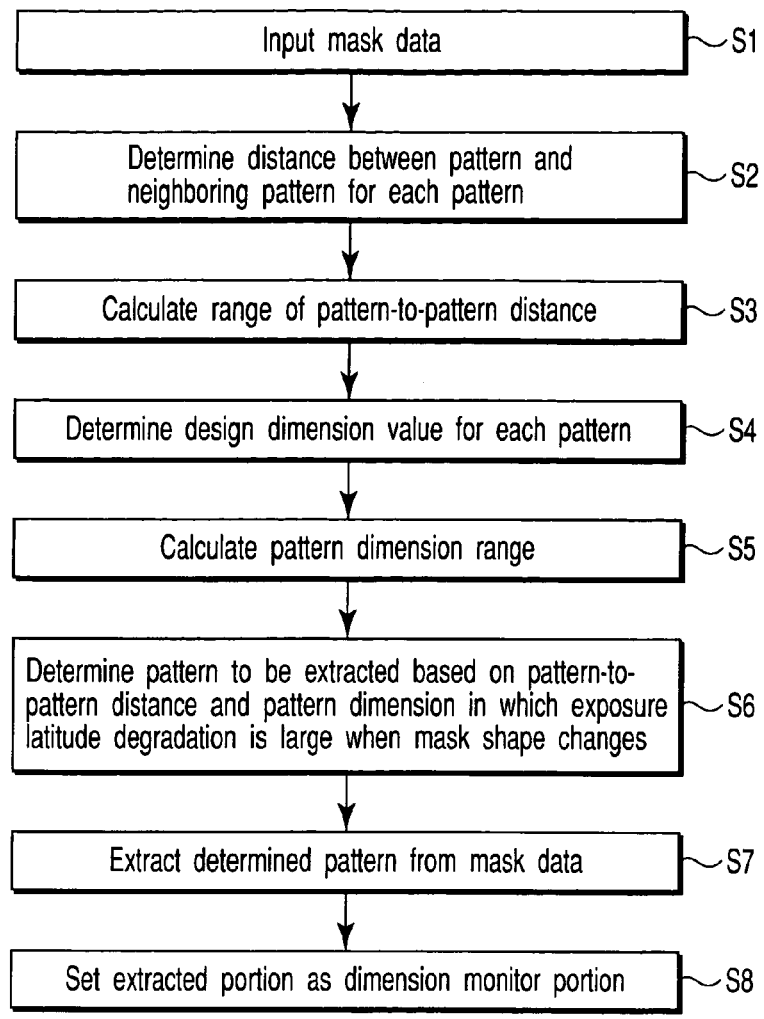
FIG. 6 is a flowchart to explain a method of manufacturing a photo mask according to a fourth embodiment of the present invention.

FIG. 6 is a flowchart to explain a method of manufacturing a photo mask according to a fourth embodiment of the present invention.

First, mask data (design data) that has undergone data processing such as proximity correction is inputted to a computer (step S1). Based on the mask data, data processing for determining the distance between neighboring patterns is carried out with respect to each pattern included in all or part of regions (step S2).

A range of the pattern-to-pattern distance is calculated from maximum and minimum values of the pattern-to-pattern distance obtained by data processing (step S3). In this case, the minimum pattern-to-pattern distance is set to 0.38 μm. As described in the third embodiment, if there exists a pattern-to-pattern distance greater than a predetermined value (e.g., 4.0 μm), the maximum pattern-to-pattern distance is not necessarily determined. Thus, if there exists a portion where the pattern-to-pattern distance is 4.0 μm, the value 4.0 μm is regarded as the maximum pattern-to-pattern distance.

Figure 11:
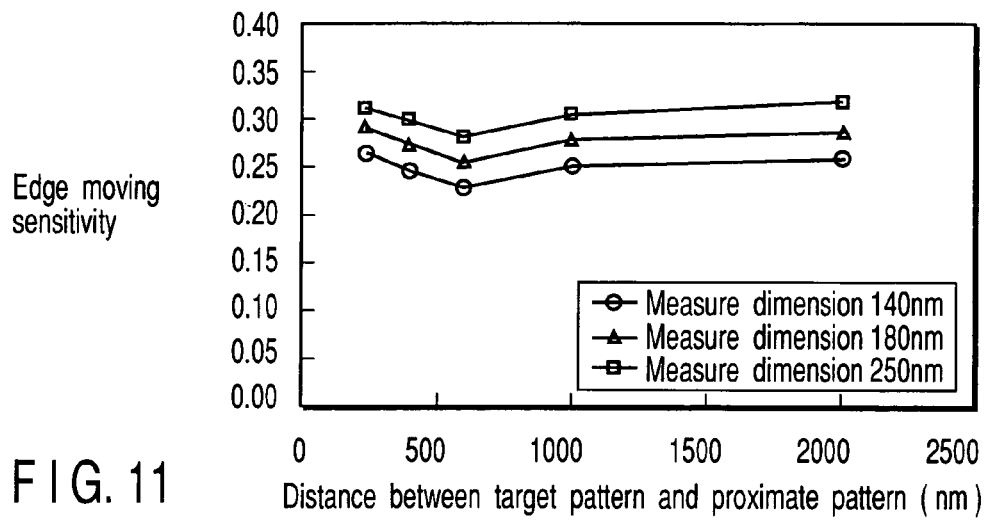
FIG. 11 is a graph to explain a relationship between a distance between neighboring patterns and edge moving sensitivity.

FIG. 11 shows lithography simulation result when target pattern dimension and the distance between the target pattern and the neighboring pattern (proximate pattern) are changed. From the result, the edge moving sensitivity becomes high when the pattern dimension is high. Therefore, when the pattern-to-pattern distance is changed, it can be seen that the pattern dimension gives influence to the edge moving sensitivity.

After step S3, data processing for determining design dimension values is carried out with respect to each pattern included in all or part of regions based on mask data (step S4). A pattern dimension range is calculated from the maximum and minimum values of the pattern dimension obtained by the data processing (step S5). In the embodiment, the pattern dimension range is 0.11 μm to 0.25 μm, and the pattern dimension having high edge moving sensitivity is set as 0.25 μm. The edge moving sensitivity becomes high when the pattern-to-pattern distance is 0.38 μm and 2.0 μm, like the third embodiment.

The following patterns are determined as patterns to be extracted (step S6). One is a pattern having pattern dimension 0.25 μm and distance between patterns 0.38 μm, and another is a pattern having pattern dimension 0.25 μm and distance between patterns 2.0 μm. Data processing is carried out in order to extract the determined pattern from mask data (step S7). A portion corresponding to the extracted pattern is set as a dimension monitor portion (dangerous portion) (step S8).

The basic operation after that is the same as steps S7 to S11 of the third embodiment, and it is finally determined whether the photo mask is non-defective or defective.

In the embodiment, the monitor portion is specified taking the pattern-to-pattern distance into consideration. By doing so, the same effect as the third embodiment is obtained, that is, it is possible to securely and readily determine whether the photo mask is non-defective or defective. In addition, the monitor portion is specified taking the pattern dimension into consideration. Therefore, it is possible to further securely and readily determine whether the photo mask is non-defective or defective.

FIFTH EMBODIMENT

Figure 7:
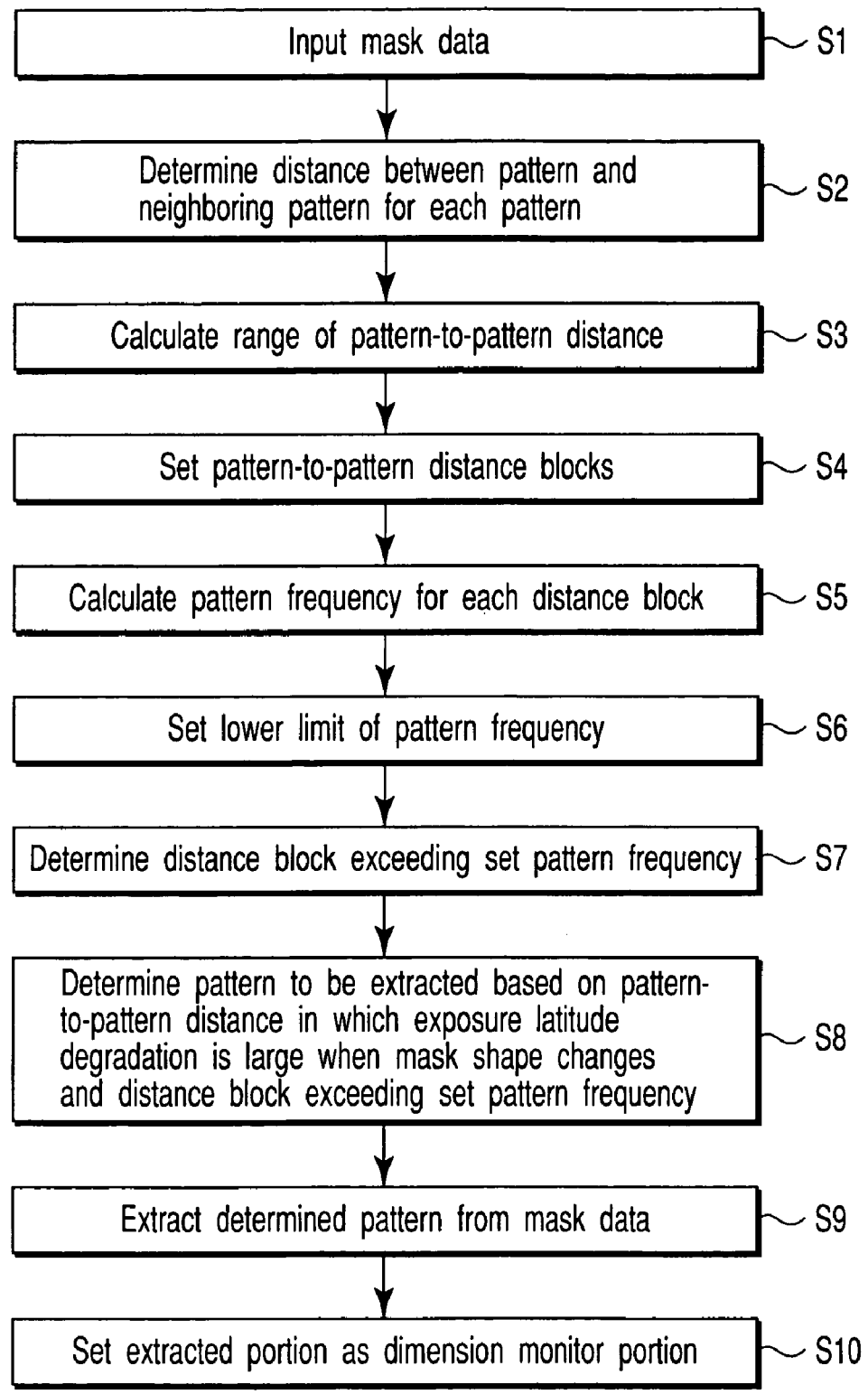
FIG. 7 is a flowchart to explain a method of manufacturing a photo mask according to a fifth embodiment of the present invention.

FIG. 7 is a flowchart to explain a method of manufacturing a photo mask according to a fifth embodiment of the present invention.

First, mask data (design data) that has undergone data processing such as proximity correction is inputted to a computer (step S1). Based on the mask data, data processing for determining the distance between neighboring patterns is carried out with respect to each pattern included in all or part of regions (step S2).

A range of the pattern-to-pattern distance is calculated from maximum and minimum values of the pattern-to-pattern distance obtained by data processing (step S3). In this case, the minimum pattern-to-pattern distance is set to 0.38 μm. As described in the third embodiment, if there exists a pattern-to-pattern distance greater than a predetermined value (e.g., 4.0 μm), the maximum pattern-to-pattern distance is not necessarily determined. Thus, if there exists a portion where the pattern-to-pattern distance is 4.0 μm, the value 4.0 μm is regarded as the maximum pattern-to-pattern distance.

The range of the pattern-to-pattern distance determined in step S3 is divided into parts so that a plurality of pattern-to-pattern distance blocks can be set (step S4). For example, a block is set every 0.02 μm in the range of the pattern-to-pattern distance from 0.38 μm to 4.0 μm, and the range of 4.0 μm or more is set as one block.

Data processing is carried out in order to calculate the number of patterns (pattern frequency) included in each block from mask data. By doing so, pattern-to-pattern distance frequency distribution is determined (step S5). For example, the number of patterns in the block having the pattern-to-pattern distance from 0.38 μm to 0.40 μm is set as about 800,000. The number of patterns in the block having the pattern-to-pattern distance from 0.60 μm to 0.62 μm is set as about 400,000. The number of patterns in the block having the pattern-to-pattern distance from 2.00 μm to 2.02 μm is set as about 200,000. The number of patterns in blocks other than above is set as about 10,000 or less. If the lower limit of the number of patterns included in one block is set as 300,000 (step S6), two blocks having the pattern-to-pattern distance from 0.38 μm to 0.40 μm and from 0.60 μm to 0.62 μm exceed the lower limit value. Therefore, these two blocks are determined as being a block exceeding the setting number 300,000 (step S7). In addition, patterns included in these blocks greatly affect a device because the number of patterns is high. Thus, these blocks should be extracted as a dimension monitor portion. In the embodiment, the edge moving sensitivity becomes high when the pattern-to-pattern distance is 0.38 μm and 2.0 μm.

Patterns having the pattern-to-pattern distance from 0.38 μm to 0.40 μm, from 0.60 μm to 0.62 μm and from 2.00 μm to 2.02 μm are determined as a pattern to be extracted (step S8). Data processing is carried out in order to extract the determined pattern from mask data (step S9). A portion corresponding to the extracted pattern is set as a dimension monitor portion (dangerous portion) (step S10).

The basic operation after that is the same as steps S7 to S11 of the third embodiment, and it is finally determined whether the photo mask is non-defective or defective.

In the embodiment, the monitor portion is specified taking the pattern-to-pattern distance into consideration. By doing so, the same effect as the third embodiment is obtained, that is, it is possible to securely and readily determine whether the photo mask is non-defective or defective. In addition, the pattern-to-pattern distance is divided into several distance ranges, and a monitor portion is specified taking the pattern frequency included in each distance range into consideration. Therefore, it is possible to further securely and readily determine whether the photo mask is non-defective or defective.

SIXTH EMBODIMENT

Figure 8:
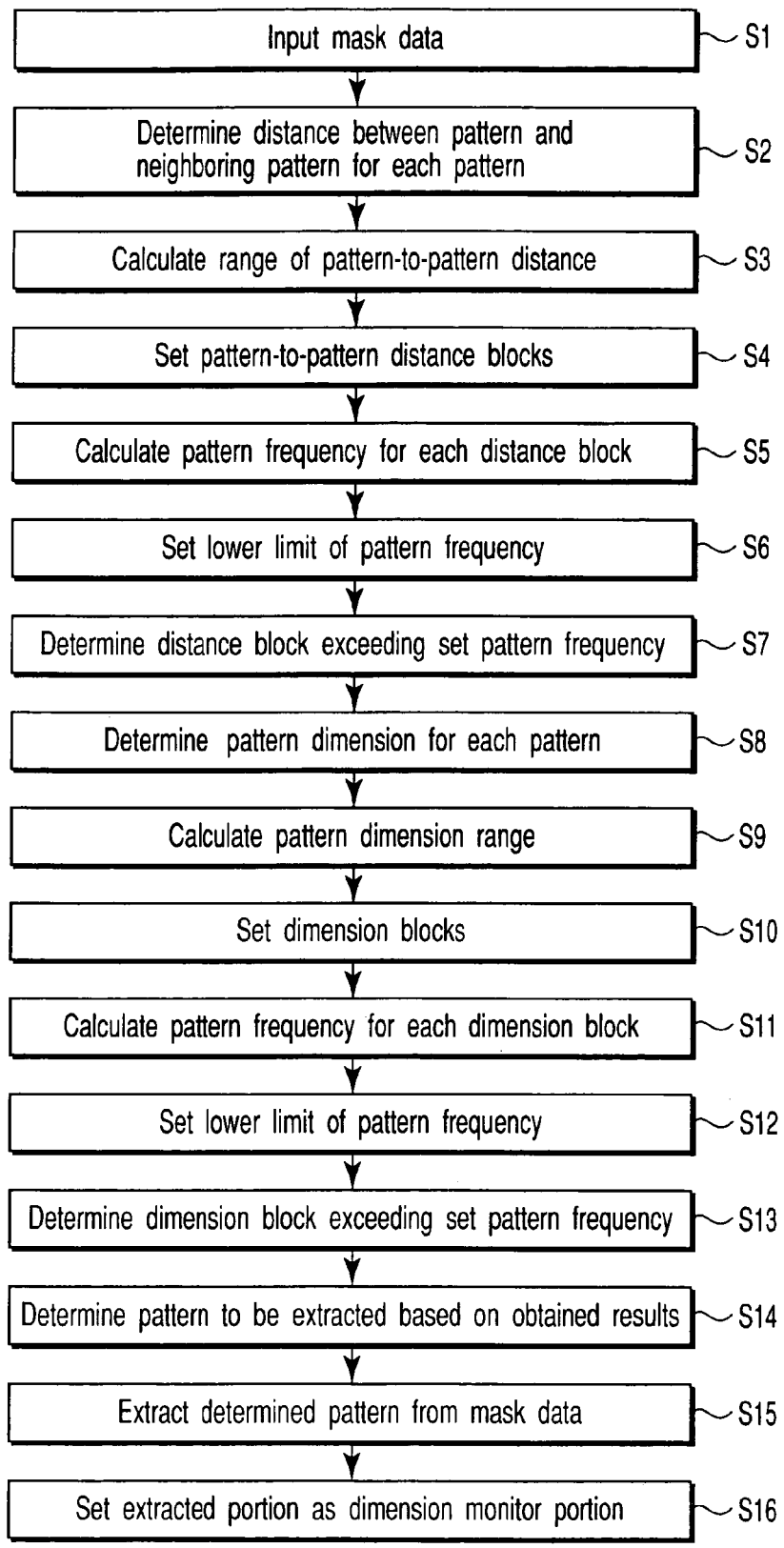
FIG. 8 is a flowchart to explain a method of manufacturing a photo mask according to a sixth embodiment of the present invention.

FIG. 8 is a flowchart to explain a method of manufacturing a photo mask according to a sixth embodiment of the present invention.

First, mask data (design data) that has undergone data processing such as proximity correction is inputted to a computer (step S1). Based on the mask data, data processing for determining the distance between neighboring patterns is carried out with respect to each pattern included in all or part of regions (step S2).

A range of the pattern-to-pattern distance is calculated from maximum and minimum values of the pattern-to-pattern distance obtained by data processing (step S3). In this case, the minimum pattern-to-pattern distance is set to 0.38 μm. As described in the third embodiment, if there exists a pattern-to-pattern distance that is greater than a predetermined value (e.g., 4.0 μm), the maximum pattern-to-pattern distance is not necessarily determined. Thus, if there exists a portion where the pattern-to-pattern distance is 4.0 μm, the value 4.0 μm is regarded as the maximum pattern-to-pattern distance.

The range of the pattern-to-pattern distance determined in step S3 is divided into some parts so that a plurality of pattern-to-pattern distance blocks can be set (step S4). For example, a block is set every 0.02 μm in the range of the pattern-to-pattern distance from 0.38 μm to 4.0 μm, and the range of 4.0 μm or more is set as one block.

Data processing is carried out in order to calculate the number of patterns (pattern frequency) included in each block from mask data. By doing so, pattern-to-pattern distance frequency distribution is determined (step S11). For example, the number of patterns of the block having the pattern-to-pattern distance from 0.38 μm to 0.40 μm is set as about 800,000. The number of patterns of the block having the pattern-to-pattern distance from 0.60 μm to 0.62 μm is set as about 400,000. The number of patterns of the block having the pattern-to-pattern distance from 2.00 μm to 2.02 μm is set as about 200,000. The number of patterns of blocks other than above is set as about 10,000 or less. If the lower limit of the number of patterns included in one block is set as 300,000 (step S6), two blocks having the pattern-to-pattern distance from 0.38 μm to 0.40 μm and from 0.60 μm to 0.62 μm exceed the lower limit value. Therefore, these two blocks are determined as being a block exceeding the setting number 300,000 (step S7). In addition, patterns included in these blocks greatly affect a device because the number of patterns is high. Thus, these blocks should be extracted as a dimension monitor portion. In the embodiment, the edge moving sensitivity becomes high when the pattern-to-pattern distance is 0.38 μm and 2.0 μm.

Based on mask data, data processing for determining dimension values is carried out with respect to each pattern included in all or part of regions (step S8). A pattern dimension range is calculated from the maximum and minimum values of the pattern dimension obtained by the foregoing data processing (step S9). In the embodiment, the pattern dimension range is from 0.11 μm to 0.25 μm, and the pattern dimension having large edge moving sensitivity is 0.25 μm.

The range of the pattern dimension determined in step S9 is divided into parts so that a plurality of pattern dimension blocks can be set (step S10). For example, a block is set every 0.01 μm in the range of the pattern dimension from 0.11 μm to 0.25 μm.

Data processing is carried out in order to calculate the number of patterns (pattern frequency) included in each block from mask data. By doing so, pattern dimension frequency distribution is determined (step S11). For example, the number of patterns of the block having the pattern dimension from 0.11 μm to 0.12 μm is set as about 600,000. The number of patterns of the block having the pattern dimension from 0.18 μm to 0.19 μm is set as about 400,000. The number of patterns of the block having the pattern dimension from 0.24 μm to 0.25 μm is set as about 100,000. The number of patterns of blocks other than above is set as about 10,000 or less. If the lower limit of the number of patterns included in one block is set as 300,000 (step S12), two blocks having the pattern dimension from 0.11 μm to 0.12 μm and from 0.18 μm to 0.19 μm exceed the lower limit value. Therefore, these two blocks are determined as being a block exceeding the setting number 300,000 (step S13). In addition, patterns included in these blocks greatly affect a device because the number of patterns is high. Thus, these blocks should be extracted as a dimension monitor portion.

A pattern to be extracted is determined considering the results obtained in the foregoing manner, that is, range (block) determined in steps S7 and S13, pattern-to-pattern distance and pattern dimension having high edge moving sensitivity (step S14). In the embodiment, the following patterns are determined as a pattern to be extracted. One is a pattern having a pattern dimension from 0.11 to 0.12 μm and a pattern-to-pattern distance from 0.38 to 0.40 μm. Another is a pattern having the pattern dimension from 0.11 to 0.12 μm and the pattern-to-pattern distance from 1.8 to 2.0 μm. Another is a pattern having the pattern dimension from 0.18 to 0.19 μm and the pattern-to-pattern distance from 0.38 to 0.40 μm. Another is a pattern having the pattern dimension from 0.18 to 0.19 μm and the pattern-to-pattern distance from 1.8 to 2.0 μm. Another is a pattern having the pattern dimension from 0.24 to 0.25 μm and the pattern-to-pattern distance from 0.38 to 0.40 μm. Further, another is a pattern having the pattern dimension from 0.24 to 0.25 μm and the pattern-to-pattern distance from 1.8 to 2.0 μm. Data processing is carried out in order to extract the determined pattern from mask data (step S15). A portion corresponding to the extracted pattern is set as dimension monitor portion (dangerous portion) (step S16).

The basic operation after that is the same as steps S7 to S11 of the third embodiment, and it is finally determined whether the photo mask is non-defective or defective.

In the embodiment, the monitor portion is specified taking the pattern-to-pattern distance into consideration. By doing so, the same effect as the third embodiment is obtained, that is, it is possible to securely and readily determine whether the photo mask is non-defective or defective. In addition, a monitor portion is specified taking the pattern dimension and frequency distribution into consideration. Therefore, it is possible to further securely and readily determine whether the photo mask is non-defective or defective.

Figure 12:
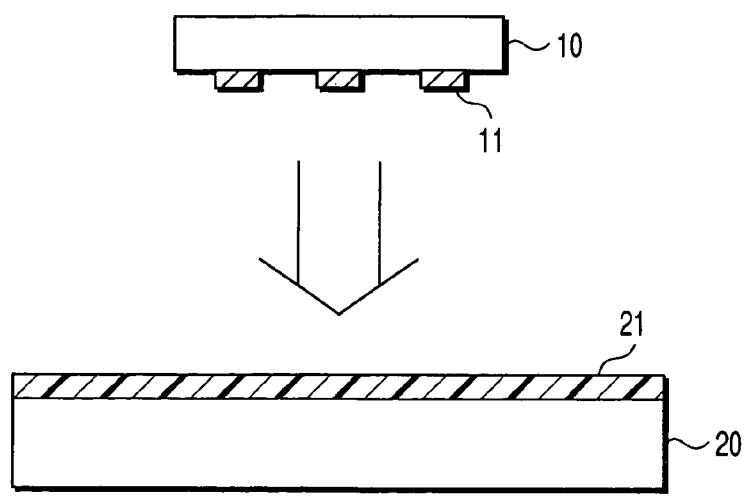
FIG. 12 is a view to explain the case of applying the photo mask manufactured by the method according the embodiments of the present invention to the manufacture of a semiconductor device.

The photo mask manufactured according to the first to sixth embodiments is applicable to the manufacture of semiconductor devices such as LSI. As seen from FIG. 12, a mask pattern 11 on a photo mask 10 is projected onto a photo resist 21 on a semiconductor substrate 20. By doing so, proper fine pattern can be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a photo mask comprising:
   preparing mask data for a mask pattern to be formed on a mask substrate;
   calculating edge moving sensitivity with respect to each of patterns included in the mask pattern using the mask data, the edge moving sensitivity corresponding to a difference between a proper exposure dose and an exposure dose to be set when a pattern edge varies;
   determining a monitor portion of the mask pattern, based on the calculated edge moving sensitivity, the monitor portion satisfying a condition that the calculated edge moving sensitivity is lower than a predetermined lower limit value or higher than a predetermined upper limit value;
   actually forming the mask pattern on the mask substrate;
   acquiring a dimension of a pattern included in that portion of the mask pattern formed on the mask substrate which corresponds to the monitor portion;
   determining an evaluation value for the mask pattern formed on the mask substrate, based on the acquired dimension; and
   determining whether the evaluation value satisfies predetermined conditions.

2. The method according to claim 1, wherein the evaluation value includes exposure latitude.

3. The method according to claim 1, further comprising calculating exposure latitude with respect to each of the patterns included in the mask pattern using the mask data, and
   wherein determining the monitor portion includes determining the monitor portion of the mask pattern, based on the calculated edge moving sensitivity and the calculated exposure latitude.

4. The method according to claim 1, further comprising calculating a deviation ΔCD from a proper CD value with respect to each of the patterns included in the mask pattern using the mask data, and
   wherein determining the monitor portion includes determining the monitor portion of the mask pattern, based on the calculated edge moving sensitivity and the calculated deviation ΔCD.

5. The method according to claim 1, wherein a calculation position of the edge moving sensitivity corresponds to a grid position used in designing the mask data.

6. The method according to claim 1, wherein a calculation position of the edge moving sensitivity corresponds to a division point or a calculation point used in proximity correction.

7. The method according to claim 1, wherein acquiring the dimension includes:
   measuring a dimension of a specified pattern included in that portion of the mask pattern formed on the mask substrate which corresponds to the monitor portion; and
   estimating a dimension of a pattern other than the specified pattern from the measured dimension of the specified pattern.

8. The method according to claim 1, wherein the mask data is subjected to proximity correction.

9. A method of manufacturing a semiconductor device comprising:
   preparing a photo mask manufactured by the method according to claim 1; and
   projecting a mask pattern of the photo mask onto a photo resist formed on a semiconductor substrate.

10. A method of manufacturing a photo mask comprising:
    preparing mask data for a mask pattern to be formed on a mask substrate;
    calculating a distance from an adjacent pattern with respect to each of patterns included in the mask pattern using the mask data;
    determining a monitor portion of the mask pattern, based on the calculated distance, the monitor portion having the calculated distance which satisfies a condition that edge moving sensitivity is lower than a predetermined lower limit value or higher than a predetermined upper limit value, the edge moving sensitivity corresponding to a difference between a proper exposure dose and an exposure dose to be set when a pattern edge varies;
    actually forming the mask pattern on the mask substrate;
    acquiring a dimension of a pattern included in that portion of the mask pattern formed on the mask substrate which corresponds to the monitor portion;
    determining an evaluation value for the mask pattern formed on the mask substrate, based on the acquired dimension; and
    determining whether the evaluation value satisfies predetermined conditions.

11. The method according to claim 10, wherein the evaluation value includes exposure latitude.

12. The method according to claim 10, further comprising acquiring a design dimension with respect to each of the patterns included in the mask pattern using the mask data, and
    wherein determining the monitor portion includes determining the monitor portion of the mask pattern, based on the calculated distance and the design dimension.

13. The method according to claim 10, further comprising determining a frequency distribution of the calculated distance, and
    wherein determining the monitor portion includes determining the monitor portion of the mask pattern, based on the calculated distance and the frequency distribution.

14. The method according to claim 10, further comprising:
   acquiring a design dimension with respect to each of the patterns included in the mask pattern using the mask data; and
   determining a frequency distribution of the design dimension, and
   wherein determining the monitor portion includes determining the monitor portion of the mask pattern, based on the calculated distance and the frequency distribution.

15. The method according to claim 10, wherein the mask data is subjected to proximity correction.

16. A method of manufacturing a semiconductor device comprising:
   preparing a photo mask manufactured by the method according to claim 10; and
   projecting a mask pattern of the photo mask onto a photo resist formed on a semiconductor substrate.

* * * * *